July 18, 1967 C. W. KAYSER ET AL 3,332,028

DYNAMIC BANDPASS FILTER AMPLIFIER HAVING MULTIPLE FEEDBACK PATHS

Filed April 29, 1964

CHARLES W. KAYSER,
PER R. PETTERSSON,
INVENTORS.

BY Luther P. Spick

ATTORNEY.

United States Patent Office 3,332,028

Patented July 18, 1967

3,332,028

DYNAMIC BANDPASS FILTER AMPLIFIER HAVING MULTIPLE FEEDBACK PATHS

Charles W. Kayser, Placentia, and Per R. Pettersson, San Pedro, Calif., assignors to The Garrett Corporation, Los Angeles, Calif., a corporation of California Filed Apr. 29, 1964, Ser. No. 363,418
6 Claims. (Cl. 330—19)

Figure 1:
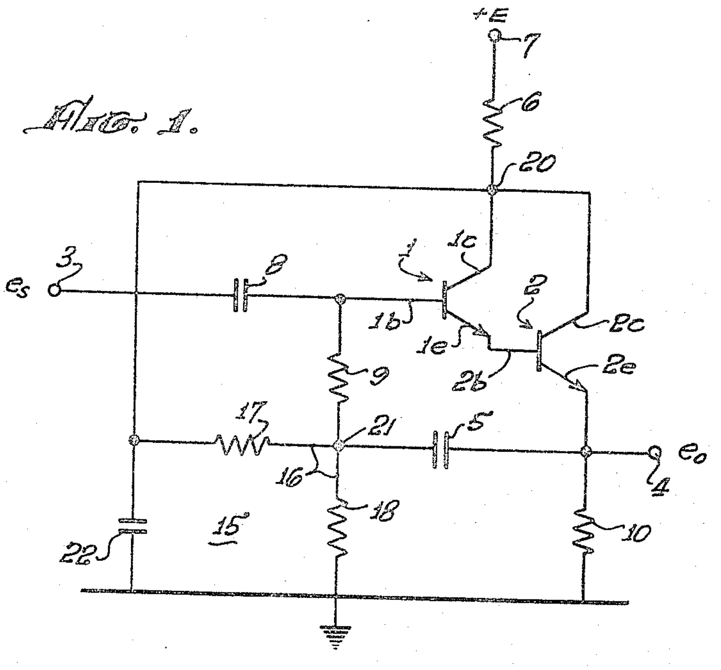

This invention pertains to transistorized, high-Q, frequency-selective amplifiers, and relates more particularly to a dynamic bandpass filter-amplifier characterized by a very high input impedance. This invention is especially useful for low frequency bandpass-preamplifier applications.

In general, the unique operating characteristics of the bandpass filter-amplifier of this invention are achieved by directly coupling two transistors in common-collector configuration and providing respective resistance-capacitance feedback circuits between the base of the first transistor and the emitter and collector of the second transistor. The impedances of the feedback circuits are selected so that the resultant regenerative feedback signal provided at the base via the external and internal transistor paths will increase rapidly in a first mode of operation over a frequency range extending from zero, where voltage gain typically will be reduced twenty-to-thirty decibels below unity, to a peaking frequency where the peak gain may be on the order of twenty-five, and a second mode of operation where the feedback signal becomes progressively less regenerative until the voltage gain of the circuit once more approaches unity for frequencies exceeding the upper frequency limit of the pass band.

The prior art is replete with conventional amplifiers of various types incorporating "bootstrap" circuitry for returning positive feedback energy from the output element to the low end of the input impedance network in order to maintain high input impedance notwithstanding large increases in the frequency of the input signal. Moreover, the achievement of high input impedance and current gain through the use of directly-coupled transistors operated in common collector configuration likewise is well-known in the art. However, it appears that a common collector amplifier having collector-to-base and emitter-to-base reactive feedback circuits to provide voltage amplification of a predetermined narrow band of low frequencies, attenuation of frequencies below the pass band, very high input and low output impedances for all frequencies, a stable, high-Q output voltage characteristic for pass band frequencies, and temperature stability, is highly novel and constitutes an important advance in the art of active bandpass filter networks. In accordance with conventional emitter follower, or common collector, theory the voltage gain never can exceed unity; that is, the amplitude of the output voltage will never exceed that of the input voltage. Hence, the achievement of stable voltage amplification greater than unity with an amplifier of this type in itself represents a meritorious advance in the state of the art.

For example, the novel dynamic filter-amplifier of this invention may be applied effectively as a filter-preamplifier for the pressure transducer of a sphygmomanometer system. Heretofore, some types of pressure transducers of sphygmomanometer systems have been unable to supply an unambiguous electrical analog of Korotkoff heart sounds representing the lower or diastolic, limit of blood pressure variation transmitted through the arterial passages of a subject. Investigation discloses that this difficulty has been attributable to the presence of strong 15–20 cycle per second "false" components intermixed with the 32–40 cycle per second "true" components. It has been found that virtual elimination, or sufficient reduction in amplitude, of the "false" frequency components renders diastolic sphygmomanometer data comparable in accuracy and reliability to that available through the use of a stethoscope in the hands of a skilled operator.

Through proper selection of resistance and capacitance elements for the feedback networks, the frequency pass band of the dynamic filter-amplifier of this invention may be pre-established to attenuate signal voltage components in the "false" 15–20 cycle per second range while amplifying those in the desired 32–40 cycle per second range. For example, the pass band characteristic may be designed so that the amplitude of the "true" signal components exceeds that of the "false" components by 40–50 decibels or more.

A further advantage of this invention when applied as a dynamic filter-preamplifier for the sphygmomanometer pressure transducer arises from its miniature dimensions. Through use of conventional packaging design principles, the filter-amplifier may be installed in the cavity between the crystal and rear wall of the usual thin disc-shaped transducer housing. Hence, the voltage amplitude of the "false" signal components may be attenuated, while the "true" signal components may be enhanced by as much as 30 decibels before their transmission via cable to the signal-processing circuitry. One of the important advantages of selective preamplification at the transducer is that the possibility of signal spoilage in transit on account of spurious electrical effects is virtually eliminated. Moreover, the very high input impedance and low output impedance of the dynamic filter-amplifier insures the efficiency of energy transfer from the crystal source to the filter-preamplifier, and from the preamplifier to the low impedance input of the transistorized signal-processing circuitry.

Although prior art techniques could be used to satisfy the frequency-selective requirements for the aforedescribed application of this invention, several unique advantages would be lost. For example, the frequency-selective pass band could be achieved with a passive filter network, a dynamic twin-T feedback network, or similar circuitry incorporated as part of the signal-processing unit. However, this would entail more components, less reliability, substantially greater bulk and weight, and greater likelihood of signal spoilage by ambient electrical noises entering the cable interconnecting the transducer and signal-processing unit.

An exemplary embodiment of this invention comprises two directly-coupled transistors operated in the common collector mode, a circuit arrangement known in the art as a "Darlington emitter follower." A first capacitive feedback circuit coupled between the emitter load resistor and the lower end of the base-biasing resistor functions as a hybrid base bootstrapping and phase shift network. A second resistance-capacitance feedback circuit coupled between the common collector and the lower end of the base-biasing resistor provides direct-current bias voltage to the input base of the transistor, and functions, in combination with the first feedback circuit, to supply a decreasingly regenerative feedback current as the frequency of the input signal increases.

In the description below, the energy returned to the base-biasing resistor from the emitter will be referred to as the bootstrap signal, while that returned from the collectors to the input base via the internal transistor feedback path and the second feedback circuit will be called the feedback signal.

For example, the collector voltage of a conventional Darlington emitter follower is one hundred and eighty degrees out of phase with the input current. However, in the circuit of this invention, the collector-to-base feedback circuit causes the collector voltage to lag the base voltage-current by an angle increasing from one hundred and eighty degrees to about two hundred and seventy degrees as input signal frequency increases. Moreover, as frequency increases, the first, or emitter-to-base feedback circuit, imparts to the collector feedback current a further lag diminishing from a maximum of ninety degrees to about zero degrees. Consequently, the feedback signal on the base may lag the base voltage-current by an angle exceeding two hundred and seventy degrees for a selected range of frequencies including a portion of the pass band, so that its effect, together with internal transistor feedback, on the output voltage developed across the emitter resistor will produce a peak voltage gain substantially above unity. As the input signal frequency rises above the peak frequency, a shunting capacitor in the collector-to-base feedback network effectively reduces external collector feedback to zero. When this occurs, the base bootstrap voltage diminishes, and the reverse feedback of energy from emitter-to-collector begins to neutralize the regenerative effect of internal transistor feedback. At low frequencies, the bootstrapping effect of reactive feedback between emitter and base is reduced markedly. In addition, regenerative internal feedback is very small, and the impedance of the input coupling capacitor is maximized. These factors combine to attenuate the input signal current. As a consequence, the low-frequency output voltage may be twenty to thirty decibels lower than the input signal.

Accordingly, it is among the important objectives of this invention to provide:

(1) A dynamic bandpass filter-amplifier;

(2) A transistorized dynamic bandpass filter-amplifier having a high input impedance for all frequencies;

(3) A stable high-Q dynamic bandpass filter-amplifier;

(4) A dynamic bandpass filter-amplifier for increasing the voltage amplitude of selected frequency components of an input signal on the order of thirty decibels;

(5) A highly-reliable, miniaturizable, transistorized dynamic filter-amplifier having a stable high-Q bandpass characteristic;

(6) A common collector amplifier characterized by a voltage gain in excess of unity;

(7) A common collector amplifier having a voltage gain in excess of unity for selected frequency components of an input signal; and (8) A transistorized dynamic bandpass filter-amplifier characterized by superior reliability, engineering simplicity, and economy of manufacture.

Figure 2:
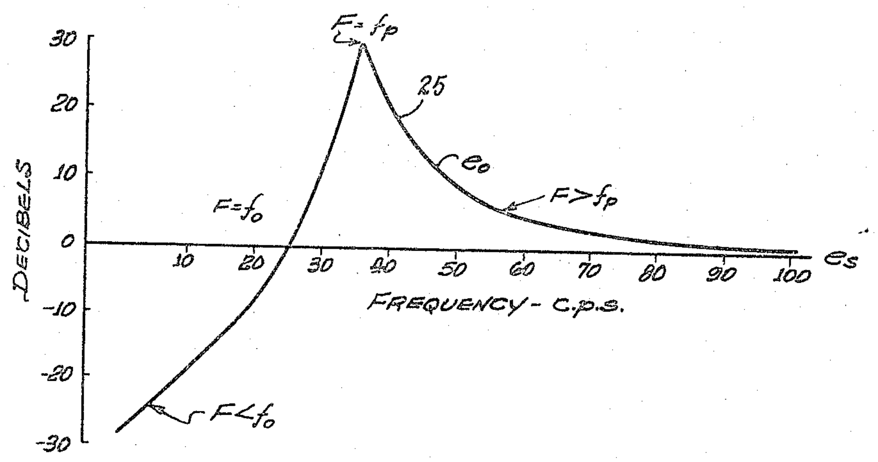

The text above is intended to summarize and explain the significance of this invention in relation to the present state of the art. For a more complete understanding of the implementation and novel features of this invention, reference is made to the description below and the drawings wherein:

FIG. 1 is a schematic diagram representing the prefrred embodiment of the invention described below, and FIG. 2 represents graphically the variation of output voltage with the frequency of the input signal.

As represented in the schematic of FIGURE 1, the preferred embodiment of this invention generally comprises first and second directly-coupled NPN transistors 1 and 2, an input termnial 3 to accommodate a source (not shown) of variable-frequency input signal voltage $e_s$, an output terminal 4 for the alternating output voltage $e_o$, a base bootstrapping capacitor 5, and a resistance-capacitance collector-to-base feedback network 15.

The directly-coupled transistors 1 and 2, operated in the common collector configuration, constitute a "Darlington" emitter follower. The respective collectors 1*c* and 2*c* are coupled via the collector load resistor 6 to a power terminal 7 for receiving a unidirectional positive voltage, and the emitter 1*e* of the first transistor is coupled directly to the base 2*b* of the second transistor. The latter transistor is coupled to output terminal 4, and to the return conductor of the source (not shown) of unidirectional voltage coupled to the power terminal 7.

The input voltage signal $e_s$ coupled to input terminal 3 passes to the base 1*b* of the first transistor via a very small coupling capacitor 8. The output signal $e_o$ is developed across an emitter load resistor 10 coupled between the emitter 2*e* and the ground source of constant potential.

It is well recognized by authorities in the art that the operating characteristics of a conventional Darlington emitter follower are analogous to those of the vacuum-tube cathode follower. These include high input and low output impedance, unity voltage gain or less, and high current gain. In the case of the Darlington emitter follower, the low frequency current gain is the product of input current and the respective current amplification factors of the transistors. For example, it is common to have input-to-out current amplifications on the order of ten-to-twenty thousand. It should be noticed that the Darlington emitter follower used in this embodiment of the invention may be replaced with a single transistor, or equivalent, having a sufficiently high current amplification factor.

To provide bias voltage of positive polarity to the input base 1*b*, the collector-to-base feedback network 15 includes a voltage divider 16 made up of series resistors 17 and 18 connected between the common collector junction 20 and the ground source of constant reference potential. The mid-junction 21 of the divider 16 is coupled to the base-biasing resistor 9. This circuit in conjunction with a collector damping capacitor 22, coupled in parallel with the voltage divider 16 also comprises the collector-to-base feedback network 15 for returning a portion of the collector voltage $e_c$ to the input base 1*b*.

The capacitor 5 coupled between the output emitter 2*e* and the base-biasing resistor 9 fulfills the hybrid functions of bootstrapping the input base 1*b* with the output voltage $e_o$ developed across emitter resistor 10, and of imparting a phase lag to the collector feedback current developed at the mid-junction 21 of voltage divider 16.

The variation in amplitude of output voltage $e_o$ with the frequency of a constant-amplitude input voltage $e_s$ is represented graphically by the curve 25 of FIGURE 2. As portrayed in this figure, the input frequency-output voltage transfer function approximates closely that of an actual embodiment having the parameters tabulated below. From the curve 25 it is evident that for frequencies of input voltage $e_s$ between 10 and 26 cycles per second, the output voltage $e_o$ rises from an amplitude about twenty decibels below that of $e_s$ to zero decibels, or unity voltage gain.

As the frequency F of $e_s$ increases from $f_o$, $e_o$ rises to a maximum of about thirty decibels above input signals $e_s$ at peak frequency $f_p$, in this instance approximately thirty-six cycles per second. Further increases in the frequency of $e_s$ result in a rapidly diminishing amplitude of output voltage $e_o$. However, within the low frequency range of interest, the amplitude of the latter never drops below unit. In fact, at one hundred cycles, the voltage gain of the circuit still exceeds zero decibels.

In explaining the operation of the dynamic bandpass filter-amplifier of this invention, the bootstrapping capacitor 5 may be regarded as a means for supplying an alternating bootstrap voltage to the lower end of the base resistor 9 while providing direct current isolation between the emitter 2*e* and base 1*b*. Moreover, the output voltage $e_o$ developed across the emitter resistor 10 cannot supply any of the energy required by the base 1*b* of the first transistor to increase the base input voltage $e_b$ to an amplitude in excess of that derived from input signal voltage $e_s$. All of the energy for this purpose must be supplied to base 1*b* via the external collector-to-base feedback network 15 or the internal feedback path through the transistors 1 and 2.

It should be understood that the following description of operation is qualitative, and intended to illustrate in terms of elementary alternating current phenomena the manner in which the signal frequency-output voltage transfer function of FIGURE 2 is produced. Although the circuit may be analyzed more thoroughly with the analytical and mathematical methods customarily applied by design engineers, the basic electrical dynamics underlying these techniques are relatively simple to visualize, and should provide an adequate intuitive understanding of the invention.

First, notice that the collector load resistor 6 and damping capacitor 22 effectively are connected in parallel across the +E power supply (not shown) coupled to power input terminal 7. The respective impedances of collector resistor 6 and damping capacitor 22 are high enough to provide, for the low frequency range of input signal $e_s$, an alternating-current voltage at junction 20 somewhat greater in amplitude than the output voltage $e_o$ developed across the emitter resistor 10. Accordingly, at the frequencies of $e_s$, the collector-to-base network 15 and bootstrap capacitor 5 constitute a divider network for the flow of a very small external alternating current from junction 20 to output terminal 4. The parameters of the external collector-to-emitter path are chosen to impart to the external current a lag at junction 21 in excess of 270° with respect to the current injected into input base 1b from input terminal 3. The maximum amplitude of collector voltage developed on junction 20 occurs at some time later than the maximum amplitude of collector current because of the leading component of collector current flowing through capacitor 22. A further lag occurs because of the charging time required by the bootstrapping capacitor 5 before the voltage developed at junction 21 can rise to its maximum amplitude. On account of these lags, the low frequency alternating current flowing in the external circuit from collector junction 20 to emitter 2e provides a regenerative feedback current to the base 1b via the biasing resistor 9.

With reference to the curve 25 of FIGURE 2, external regenerative feedback from collector-to-base may occur in the range where the frequency of $e_s$ is between $F=0$ and the peaking frequency, $F=f_p$. For frequencies of $e_s$ between $F=0$, and the unity gain or zero decibel frequency, $F=f_o$, the regenerative feedback in the external collector-to-emitter loop is insufficient to counteract the factors which attenuate the output voltage $e_o$. These include the very large reactance of coupling capacitor 8 and the relative inefficiency of bootstrapping via capacitor 5 at these frequencies. The ineffectiveness of bootstrapping arises from the fact that the flow of current in the external loop is from junction 20 to the emitter 2e. Furthermore, the low boostrapping voltage at junction 21 results in the loss of a portion of the input signal $e_s$ reaching the base 1b. This is trantamount to a reduction of the base input impedance, as regarded from the collector-base junction of transistor 1, and means that regenerative feedback within transistors 1 and 2 is negligible.

As the input signal frequency increases from $F<f_o$ to $F=f_p$, the amplitude of the collector voltage developed at junction 20 tends to diminish on account of the decreasing reactance of damping capacitor 22, and tends to approach the amplitude of the output voltage $e_o$ developed across the emitter load resistor 10. However, for the lower frequency range of input signal $e_s$, this diminution does not occur rapidly enough to compensate for the effect of decreasing reactance of the input coupling capacitor 8 which provides more and more input current to the base 1b. However, when the frequency of $e_s$ has increased sufficiently, the relative amplitudes of the collector voltage at junction 20 and output voltage $e_o$ rise high enough to initiate effective bootstrapping action at junction 21. This is tantamount to a substantial increase in the input impedance of base 1b as regarded from the collector-base junctions of transistors 1 and 2. Inasmuch as the specifications of transistors 1 and 2 include high amplification factors and high collector-base capacitances, the internal positive feedback from collector junction 20 begins to enhance the flow of collector-emitter current.

The aforedescribed enhancement of collector-emitter current continues until the frequency of input signal $e_s$ becomes equal to the peak frequency $f_o$. At this point, the respective amplitudes and relative phases of collector and emitter voltages at junctions 20 and 21 respectively cease to provide adequate bootstrapping for base 1b. This occurs because the diminution of the reactive collector load impedance has lowered the collector voltage at junction 21 below the output voltage $e_o$. As a result, the direction of current flow in the external loop tends to reverse, and bootstrapping at junction 21 is reduced in efficiency by the loss of voltage at junction 21. In other words, the loss of sustaining collector voltage lowers the effective impedance of resistor 17, and bootstrap voltage is dissipated markedly with further increases in frequency. The current component returned to collector junction 20 under these conditions also tends to neutralize the internal feedback, and this factor likewise causes an abrupt reduction in collector-emitter current, and consequent loss of gain.

The circuit components tabulated below were used in an actual embodiment of the invention:

| | | |
|---|---|---|
| Transistors **1** and **2** (composite) | FSP | 77 |
| Capacitor **5** | microfarad | 1.8 |
| Resistor **6** | ohms | 4,200 |
| Capacitor **8** | microfarads | .0047 |
| Resistor **9** | ohms | 100,000 |
| Resistor **10** | ohms | 1,300 |
| Resistors **17** and **18** | ohms | 51,000 |
| Capacitor **22** | microfarads | 3 |

It is anticipated that the novel concepts expressed or inferable from the drawings and text of this disclosure will enable the design of a variety of embodiments within the scope of this invention as represented in the claims set forth below.

We claim:

1. A dynamic bandpass filter-amplifier comprising:
first and second transistors which each include a base, emitter, and collector, said transistors being intercoupled to form compound connected transistors with the emitter of the first transistor being connected to the base of the second transistors and having their collectors directly interconnected at a common collector junction;
an input terminal for accommodating a source of alternating-current input signal;
an input coupling capacitor connected between the input terminal and the base of the first of the compound connected transistors;
means coupled to the first and second transistors for biasing the first transistor for operation in the common-collector mode, the biasing means including,
a base-biasing resistor coupled to the compound connected transistors at a junction located between the input coupling capacitor and the base of the first transistor,
a collector load resistor coupled to the common collector junction,
and an emitter load resistor coupled to the emitter of the second transistor;
and means including the biasing means coupled to the bsae-biasing resistor, the common collector junctions and the second transistor emitter, and responsive only to alternating current within a preselected range of frequencies for effecting a feedback of alternating-current energy from the interconnected collectors to the base of the first transistor, so that the ratio of output voltage developed across the emitter load resistor to the input signal voltage will exceed unity.

2. A dynamic bandpass filter-amplifier comprising:

first and second transistors which each include a base, emitter, and collector, said transistors being intercoupled to form compound connected transistors with the emitter of the first transistor being connected to the base of the second transistor and having their collectors interconnected for operation in common-collector mode;

an input terminal for accommodating a source of alternating-current input signal;

an input coupling capacitor connected between the input terminal and the base of the first of the compounded transistors;

means coupled to the compound connected first and second transistors for biasing the first transistor for operation in the common-collector mode, the biasing means including, a base-biasing resistor coupled to the compound connected transistors at a junction between the input coupling capacitor and the base of the first transistor, a collector load resistor coupled to the interconnected collectors, and an emitter load resistor coupled to the emitter of the second transistor;

means coupled to the interconnected collectors for developing an alternating-current collector voltage having an amplitude in excess of the voltage developed at the emitter of the second transistor whenever the input signal frequency is greater than zero and lower than a predetermined higher frequency, and a collector voltage lower than the second transistor emitter voltage whenever the input signal frequency exceeds the predetermined higher frequency;

and means coupled to the interconnected collectors, the other extremity of the base-biasing resistor and the emitter terminal of the second transistor, and responsive only to alternating-current frequencies within a predetermined range of frequencies including the pass band, for effecting a regenerative feedback of collector current to the base of the first transistor.

3. A dynamic bandpass filter-amplifier utilizing transistors operated in the common-collector mode, and characterized by a pass band voltage gain exceeding unity, the filter-amplifier comprising:

a compound connected transistor circuit including first and second transistors each having a collector, a base, and an emitter, the emitter of the first transistor being connected to the base of the second transistor and the collectors of the transistors being interconnected for common collector mode operation;

an input terminal for accommodating a variable-frequency input signal source;

an input-signal coupling capacitor connected between the input terminal and the base of the first transistor, the coupling capacitor having a reactive impedance in excess of the input impedance of the compound connected transistor circuit whenever the input signal frequency is less than a predetermined frequency within the pass band;

means coupled to the compound connected transistor circuit for biasing same for operation in the common-collector mode, the biasing means including, a base-biasing resistor coupled to the compound connected transistor circuit at a junction between the coupling capacitor and the base of the first transistor, a collector load resistor coupled to the common collectors of the compound transistor circuit, and an emitter load resistor coupled to the emitter of the second transistor of the compound connected transistor circuit;

a first resistance-capacitance network including the collector load resistor coupled effectively between the interconnected collectors and the base biasing resistor for developing a collector voltage in excess of unity whenever the input signal frequency is less than the predetermined frequency;

and a bootstrapping capacitor coupled between the emitter of the second transistor and the base-biasing resistor for maximizing the effective base input impedance of the compound connected transistor circuit at the input-signal frequency corresponding to peak emitter voltage gain.

4. A dynamic bandpass filter-amplifier utilizing transistors operated in the common-collector mode, and characterized by a pass band voltage gain exceeding unity, the filter-amplifier comprising:

a compound connected transistor circuit including first and second transistors each having a collector, a base, and an emitter, the emitter of the first transistor being connected to the base of the second transistor and the collectors of the transistors being interconnected for common-collector mode operation;

an input terminal for accommodating a variable-frequency input signal source;

an input-signal coupling capacitor connected between the input terminal and the base of the first transistor, the coupling capacitor having a reactive impedance in excess of the input impedance of the compound connected transistor circuit whenever the input signal frequency is less than a predetermined frequency within the pass band;

means coupled to the compound connected transistor circuit for biasing same for operation in the common-collector mode, the biasing means including, a base-biasing resistor coupled to the compound connected transistor circuit at a junction between the coupling capacitor and the base of the first transistor, a collector load resistor coupled to the common collectors of the compound transistor circuit, and an emitter load resistor coupled to the emitter of the second transistor of the compound connected transistor circuit;

means coupled to the base-biasing resistor and the interconnected collectors and the emitter of the second transistor, and including the biasing means in combination with at least two nondissipative impedance elements for conducting alternating current bi-directionally between the interconnected collectors and the emitter of the second transistor in response to the effect of input-signal frequency variations on the relative magnitudes of the collector and emitter load impedances, so that maximum base input impedance, maximum external and internal transistor feedback current to the base, and maximum emitter voltage exceeding the input signal voltage occur simultaneously whenever the respective amplitudes and phases of the collector and emitter voltages result in minimization at least of the current flow through the conducting means.

5. A dynamic bandpass filter-amplifier comprising:

a semiconductor current amplification device having base, emitter, and collector terminals;

an input terminal to accommodate a source of input signal voltage;

an input coupling capacitor coupled between the input terminal and the base terminal, the coupling capacitor having a reactive impedance in excess of the input impedance of the semi-conductor current amplification device whenever the input signal frequency is less than a predetermined frequency within a pass band;

means coupled to the amplification device for biasing the latter for operation in the common-collector mode, the biasing means including, a base biasing resistor coupled to the amplification device at a junction between the base terminal and the input coupling capacitor, a collector load resistor coupled to the collector terminal, and an emitter load resistor coupled to the emitter terminal;

a first resistance-capacitance network including the collectcr load resistor coupled effectively between the collector terminal and the base biasing resistor for developing a collector voltage in excess of unity whenever the input signal frequency is less than said predetermined frequency; and a bootstrapping capacitor coupled between the emitter terminal and the base biasing resistor for maximizing the effective base input impedance of the semiconductor current amplification device at the input signal frequency corresponding to peak emitter voltage gain.

6. A dynamic bandpass filter-amplifier comprising:

a semiconductor current amplification device having base, emitter, and collector terminals;

an input terminal to accommodate a source of input signal voltage;

an input coupling capacitor coupled between the input terminal and the base terminal;

means coupled to the amplification device for biasing same for operation in the common-collector mode, the biasing means including, a base biasing resistor coupled to the amplification device at a junction between the base terminal and the input coupling capacitor, a collector load resistor coupled to the collector terminal, and an emitter load resistor coupled to the emitter terminal;

and means including the biasing means coupled to the base-biasing resistor, and coupled between the collector terminal and the emitter terminal and responsive only to alternating current within preselected frequency limits including the bandpass frequency range, for effecting a feedback of alternating-current energy from the collector terminal to the base terminal, so that the ratio of output voltage developed across the emitter load resistor to the input voltage will exceed unity.

References Cited

UNITED STATES PATENTS

| | | | |
|---|---|---|---|
| 2,663,806 | 12/1953 | Darlington | 330—19 XR |
| 3,068,327 | 12/1962 | Davidson | 330—25 XR |

OTHER REFERENCES

Davidson: Transistor AC Amplifier with High Input Impedance, pages 42–48, Semiconductor Products, March 1960, Copy in Group 250, 330–28.

ROY LAKE, *Primary Examiner.*

E. C. FOLSOM, *Assistant Examiner.*